United States Patent
Liu et al.

(10) Patent No.: US 10,810,398 B2
(45) Date of Patent: Oct. 20, 2020

(54) DISPLAY PANEL FOR FINGERPRINT RECOGNITION AND DISPLAY DEVICE

(71) Applicant: Shanghai Tianma AM-OLED Co., Ltd., Shanghai (CN)

(72) Inventors: Min Liu, Shanghai (CN); Lijing Han, Shanghai (CN); Xian Chen, Shanghai (CN); Yu Xin, Shanghai (CN); Nannan Song, Shanghai (CN); Zuhua Li, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 16/232,131

(22) Filed: Dec. 26, 2018

(65) Prior Publication Data
US 2019/0332844 A1    Oct. 31, 2019

(30) Foreign Application Priority Data
Apr. 27, 2018 (CN) .......................... 2018 1 0394145

(51) Int. Cl.
*G06K 9/00*    (2006.01)
*H01L 27/146*    (2006.01)

(52) U.S. Cl.
CPC ...... *G06K 9/0004* (2013.01); *H01L 27/14678* (2013.01)

(58) Field of Classification Search
CPC .... G06K 9/0004; G06K 9/00006–0012; H01L 27/14678; G09G 3/32–3291
See application file for complete search history.

(56) References Cited

U.S. PATENT DOCUMENTS

| 2014/0091328 A1* | 4/2014 | Ishiguro | A61B 5/1455 257/84 |
| 2017/0316252 A1* | 11/2017 | Yang | G06K 9/00087 |
| 2019/0019850 A1* | 1/2019 | Xu | H01L 27/3211 |

FOREIGN PATENT DOCUMENTS

CN    107330426 A    11/2017

* cited by examiner

*Primary Examiner* — Stephen G Sherman
(74) *Attorney, Agent, or Firm* — Miller, Matthias & Hull LLP (57) ABSTRACT

Provided are a display panel and a display device. The display panel includes a display assembly, which includes a base substrate and a plurality of light-emitting units disposed on one side of the base substrate, where each of the plurality of light-emitting unit includes a reflective electrode; a fingerprint recognition assembly, which is disposed on one side of the reflective electrode facing away from a light emitting surface of the light-emitting unit, and includes at least one fingerprint recognition unit which is configured to perform fingerprint recognition; and a first reflecting layer, which is disposed on one side of the reflective electrode facing to the fingerprint recognition assembly and includes at least one first reflecting unit, where at least part of a vertical projection of the first reflecting unit on a film layer where the fingerprint recognition unit is located is in an area other than the fingerprint recognition unit.

16 Claims, 10 Drawing Sheets

DISPLAY PANEL FOR FINGERPRINT RECOGNITION AND DISPLAY DEVICE

CROSS-REFERENCES TO RELATED APPLICATIONS

This application claims priority to Chinese patent application No. 201810394145.2 filed on Apr. 27, 2018, the disclosure of which is incorporated herein by reference in its entirety.

TECHNICAL FIELD

The present disclosure relates to display technologies and, in particular, to a display panel and a display device.

BACKGROUND

Everyone's dermatoglyph (including a fingerprint) is different from a pattern, a breakpoint and an intersection point, showing uniqueness and remaining unchanged throughout life. Accordingly, everyone's true identity can be verified via dermatoglyph recognition technology. Fingerprints are formed on the surface of the end of a person's fingers. Since line features of the fingerprints can be easily be acquired, we can identify a person with his fingerprints to verify his real identity by comparing his fingerprints with pre-stored fingerprint data, and that is the fingerprint recognition technology. In recent years, thanks to electronic integrated manufacturing technologies and fast and reliable algorithm research, an optical fingerprint recognition technology in the fingerprint recognition technology has begun to enter in our daily life and becomes a technology, which is researched in-depth, widely applied and developed to a maturity stage, in a biological detection.

At present, fingerprint recognition technology is usually combined with display technology, so that a display panel not only has a display function, but also can carry out fingerprint recognition. Therefore, functions of the display panel have been enriched and the security performance of the display panel is improved. Furthermore, the combination of the optical fingerprint recognition technology and the display technology may enable a finger recognition area to be disposed in a display area, thereby overcoming the problem in which the screen ratio of the display panel is relatively small caused by setting the finger recognition area in a non-display area. However, the success rate of fingerprint recognition of the existing display panel needs to be further improved.

SUMMARY

The present disclosure provides a display panel and a display device to improve the light utilization rate of fingerprint signal light of the display panel and further to improve the success rate of fingerprint recognition of the display panel.

In a first aspect, the present disclosure provides a display panel. The display panel includes:

a display assembly, where the display assembly includes a base substrate and a plurality of light-emitting units disposed on one side of the base substrate, and each of the plurality of light-emitting unit includes a reflective electrode;

a fingerprint recognition assembly disposed on one side of the reflective electrode facing away from a light emitting surface of the plurality of light-emitting units, where the fingerprint recognition assembly includes at least one fingerprint recognition unit which is configured to perform fingerprint recognition; and a first reflecting layer disposed on one side of the reflective electrode facing to the fingerprint recognition assembly, where the first reflecting layer includes at least one first reflecting unit, and at least part of a vertical projection of the first reflecting unit on a film layer where the fingerprint recognition unit is located is in an area other than the fingerprint recognition unit.

In a second aspect, the present disclosure further provides a display device including the display panel described in the first aspect.

The display panel provided by the present disclosure disposes a first reflecting layer. The first reflecting layer is disposed on one side of a reflective electrode facing to a fingerprint recognition assembly, the first reflecting layer includes at least one first reflecting unit, and part or all of a vertical projection of the first reflecting unit on a film layer where a finger recognition unit is located is in an area other than the finger recognition unit. At least part of light, which is not irradiated to the fingerprint recognition unit, of light reflected by a touch object (i.e., a finger) is reflected by the first reflecting layer, reflected light formed after the reflection of the first reflecting unit is reflected by the reflective electrode of a light-emitting unit for a second time, and reflected light formed after the secondary reflection is irradiated to the finger recognition unit and received by the finger recognition unit to perform fingerprint recognition. In view of this, at least part of fingerprint signal light which is not directly irradiated to the fingerprint recognition unit in the existing display panel is irradiated to the fingerprint recognition unit via the reflection of the first reflecting unit and the reflective electrode, to increase fingerprint signal light received by the fingerprint recognition unit. Therefore, the utilization rate of the light reflected by the touch object is increased, thereby improving the success rate of fingerprint recognition of the display panel.

DETAILED DESCRIPTION

The present disclosure will be further described in detail in conjunction with the drawings and embodiments. It should be understood that, the embodiments set forth below are intended to illustrate and not to limit the present disclosure. Additionally, it should be noted that, in order to facilitate description, only part, not all, of structures related to the present disclosure are illustrated in the drawings.

Figure 1:
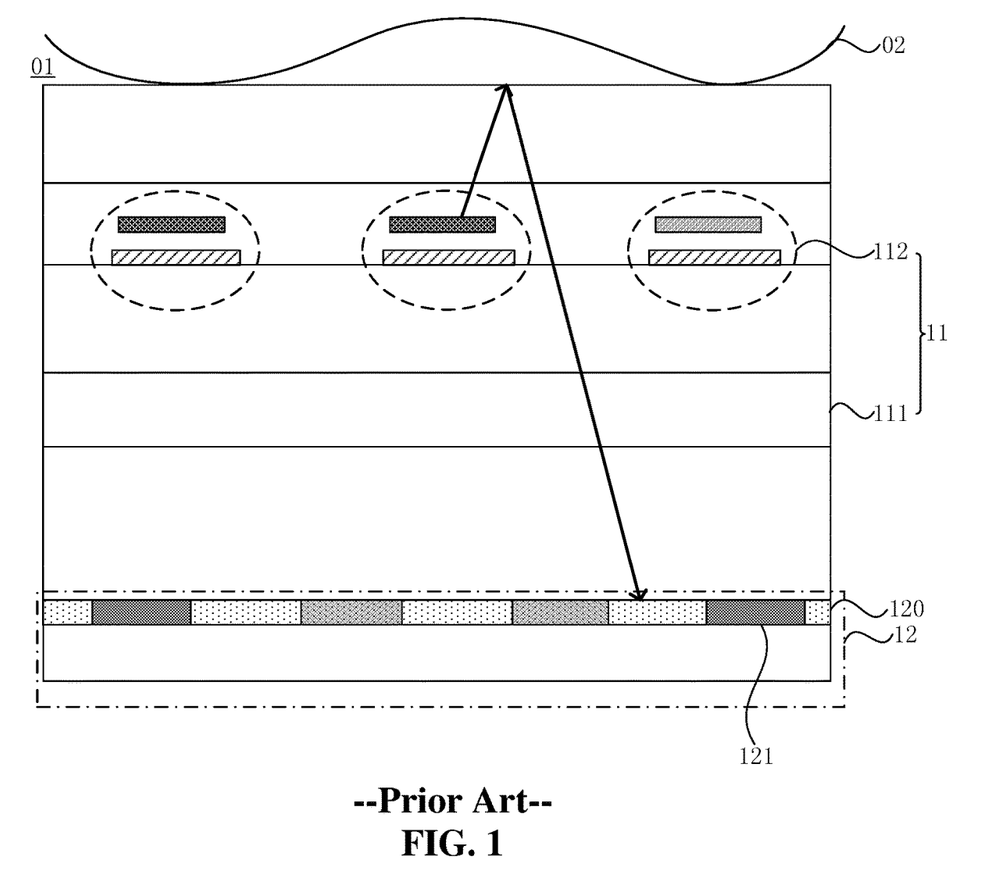
FIG. 1 is a sectional view of a structure of an existing display panel.

FIG. 1 is a sectional view of a structure of a display panel in a prior art. Referring to FIG. 1, the display panel 01 includes a display assembly 11 and a fingerprint recognition assembly 12. The display assembly 11 includes a base substrate 111 and a plurality of light-emitting units 112 disposed on one side of the base substrate 111. The fingerprint recognition assembly 12 includes at least one fingerprint recognition unit 121, and the fingerprint recognition unit 121 is configured to perform fingerprint recognition.

Specifically, an optical fingerprint recognition method is adopted in the fingerprint recognition unit 121, light reflected from different positions of a fingerprint of a touch object 02 enters into the fingerprint recognition unit 121, and the light reflected from the touch object 02 is received by the fingerprint recognition unit 121 so as to generate electrical signals related to features of the fingerprint of the touch object 02. A concave-convex changed texture (a valley and a ridge) exists in the fingerprint, and since a refractive index of a finger is almost the same as that of the display panel 01, when light emitted from the light-emitting unit 112 arrives at a surface where the ridge of the fingerprint contacts with the display panel, the light directly enters into the finger, and when light emitted from the light-emitting unit 112 arrives at a surface where the valley of the fingerprint contacts with the display panel, the light is reflected or even totally reflected. The light arriving at the valley of the fingerprint may be detected by the fingerprint recognition unit 121, so that the features of the touch object 02 can be reflected by whether there are feedback electrical signals or not in the fingerprint recognition unit 121. Therefore, a function of fingerprint recognition of the display panel 01 is achieved. Exemplarily, an electrical signal fed back by the fingerprint recognition unit 121 may be a current signal or a voltage signal.

In an existing display panel, light reflected by the touch object 02 cannot be completely irradiated to the fingerprint recognition unit 121. That is, fingerprint signal light reflected by the touch object cannot completely be received by the fingerprint recognition unit 121 and part of the fingerprint signal light is irradiated to an area between fingerprint recognition units 121. Therefore, the strength of light signals received by the fingerprint recognition unit 121 is relatively small, thereby causing a relatively low success rate of fingerprint recognition of the display panel.

To solve the above-mentioned problem, the present disclosure provides a display panel to improve the light utilization rate and further to improve the success rate of fingerprint recognition of the display panel.

Figure 2:
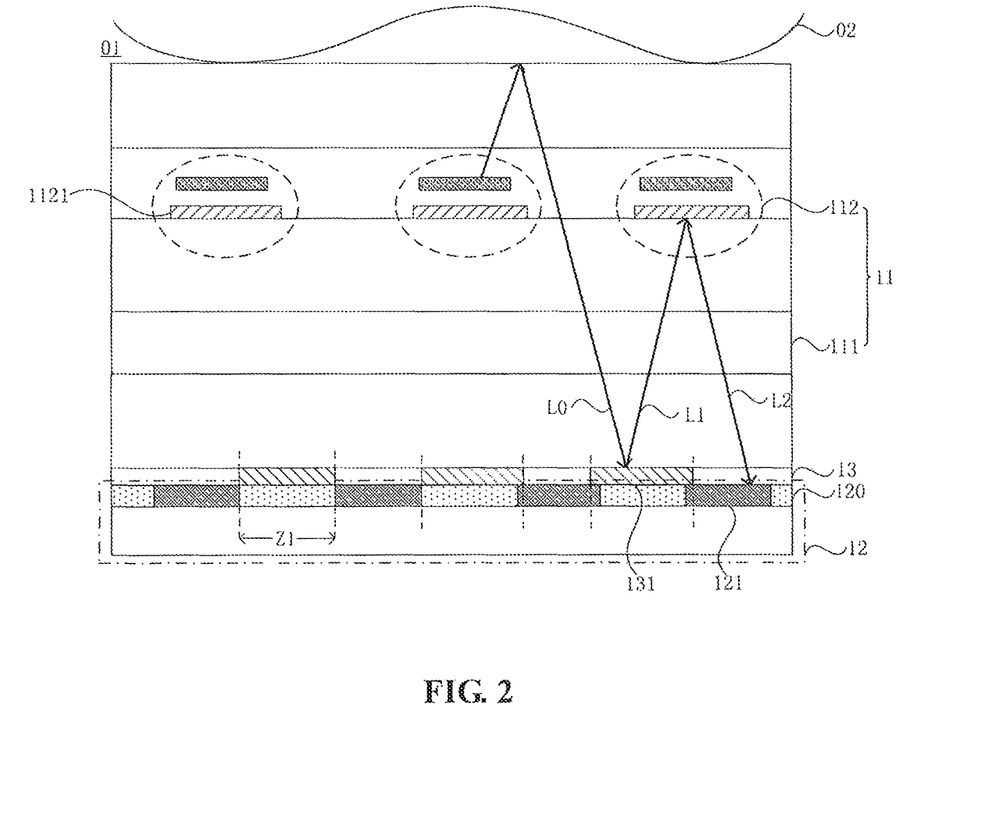
FIG. 2 is a sectional view of a structure of a display panel according to an embodiment of the present disclosure.

FIG. 2 is a sectional view of a structure of a display panel according to an embodiment of the present disclosure. Referring to FIG. 2, the display panel 01 includes: a display assembly 11, which includes a base substrate 111 and a plurality of light-emitting units 112 disposed on one side of the base substrate 111, each of plurality of light-emitting units 112 includes a reflective electrode 1121; a fingerprint recognition assembly 12, which is disposed on one side of the reflective electrode 1121 facing away from a light emitting surface of the light-emitting unit 112 and includes at least one fingerprint recognition unit 121, and the fingerprint recognition unit 121 is configured to perform fingerprint recognition; and a first reflecting layer 13 which is disposed on one side of the reflective electrode 1121 facing to the fingerprint recognition assembly 12 and includes at least one first reflecting unit 131, where at least part of a vertical projection Z1 of the first reflecting unit 131 on a film layer 120 where the fingerprint recognition unit 121 is located in an area other than the fingerprint recognition unit 121.

At least part of light L0, which is not irradiated to the fingerprint recognition unit 121, reflected by the touch object 02 is irradiated to the first reflecting unit 131. Light L0 which is irradiated to the first reflecting unit 131 is reflected by the first reflecting unit 131 to form first reflected light L1. The first reflected light L1 is irradiated to the reflective electrode 1121 and then reflected by the reflective electrode 1121 for a second time to form second reflected light L2, and the second reflected light L2 is irradiated to the fingerprint recognition unit 121 and received by the fingerprint recognition unit 121. Therefore, after two reflection processes, i.e., the reflection of the first reflecting unit 131 and the reflection of the reflective electrode 1121, at least part of the light L0 (the light which is irradiated to the area other than the fingerprint recognition unit 121 in the related art), which is not directly irradiated to the fingerprint recognition unit 121, of light reflected by the touch object 02 may be finally (exemplarily, the light path is L0-L1-L2) received by the fingerprint recognition unit, so that the fingerprint features of the touch object 02 represented by the light L0 may be recognized by the fingerprint recognition unit 121. As a result, the utilization rate of the light reflected by the touch object 02 by the display panel 01 is improved by providing the first reflection unit 131, thereby improving the success rate of fingerprint recognition of the display panel. On the basis of the improvement of the light utilization rate described above, the brightness of the light-emitting unit 112 in the fingerprint recognition region may be decreased, thereby preventing the light-emitting unit 112 from emitting high-brightness light during the fingerprint recognition process. Therefore, the service life of the light-emitting material in the light-emitting unit 112 may be prolonged, thereby prolonging the service life of the display panel 01.

It should be noted that the above-mentioned display panel 01 may include a top emission structure or a bottom emission structure, as long as the fingerprint recognition assembly 12 and the first reflecting layer 13 are disposed on a backlight side of the light-emitting unit 112, and no limitations are made for it in the present disclosure.

In addition, merely three light-emitting units 112, three first reflecting units 131 and four fingerprint recognition units 121 are exemplarily shown in FIG. 2, which are not intended to limit the display panel provided by the present disclosure. The number of the light-emitting units 112, the first reflecting units 131 and the fingerprint recognition units 121 may be set according to actual requirements of the display panel 01.

In this embodiment, the reflective electrode is reused as a reflecting unit for reflecting fingerprint signal light. At least part of the fingerprint signal light reflected by the first reflecting unit, which is not directly irradiated to the fingerprint recognition unit, may be reflected by the reflective electrode of the light-emitting unit to the fingerprint recognition unit and received by the fingerprint recognition unit to perform fingerprint recognition. In view of this, at least part of fingerprint signal light which is not directly irradiated to the fingerprint recognition unit in the existing display panel is irradiated to the fingerprint recognition unit via the reflection of the first reflecting unit and the reflective electrode, so that the amount of the fingerprint signal light received by the fingerprint recognition unit is increased. Therefore, the utilization rate of the light reflected by the touch object is increased, thereby improving the success rate of fingerprint recognition of the display panel.

Figure 3:
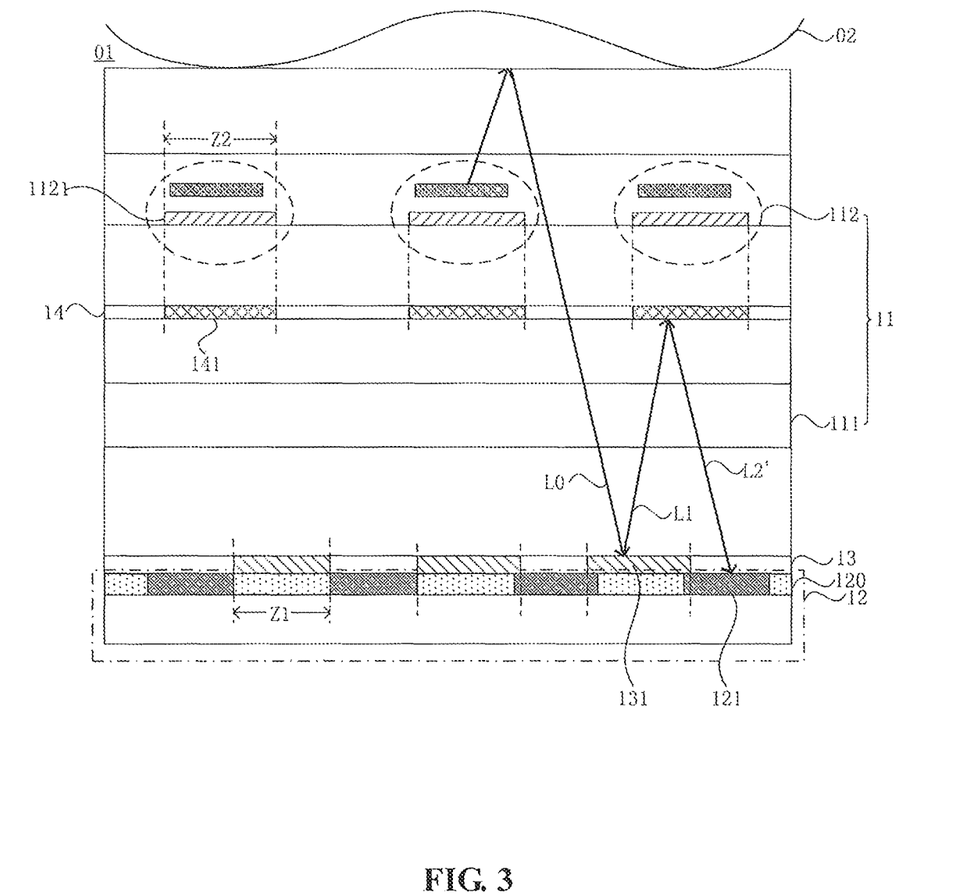
FIG. 3 is a sectional view of a structure of another display panel according to an embodiment of the present disclosure.

FIG. 3 is a sectional view of a structure of another display panel according to an embodiment of the present disclosure. Referring to FIG. 3, on the basis of FIG. 2, the display panel 01 further includes a second reflecting layer 14 disposed between the reflective electrode 1121 and the first reflecting layer 13, where the second reflecting layer 14 includes at least one second reflecting unit 141, and a vertical projection Z2 of the second reflecting unit 141 on a film layer where the reflective electrode 1121 is located is located in the reflective electrode 1121.

First reflected light L1 reflected by the first reflecting unit 131 is irradiated to the second reflecting unit 141 and then reflected by the second reflecting unit 14 for a second time to form second reflected light L2', and the second reflected light L2' is received by the fingerprint recognition unit 121. In the display panel illustrated in FIG. 2, since the reflective electrode 1121 is included in the light-emitting unit 121, when the light L1 is reflected by the reflective electrode 1121 for a second time, the reflective electrode 1121 is required to satisfy both the light emission requirement of the light-emitting unit 112 and the reflectivity requirement of the secondary reflection, thereby increasing the design difficulty of the reflective electrode 1121. In view of this, by configuring the second reflecting unit 141 to satisfy the reflectivity requirement of the secondary reflection, the reflectivity requirement of the secondary reflection may be separated from the light emission requirement of the light-emitting unit 112 which the reflective electrode 1121 is required to satisfy, so that the design difficulty of the second reflecting unit 141 and the reflective electrode is simplified, thereby simplifying the design difficulty of the whole display panel.

At the same time, since the reflectivity of the second reflecting unit 141 is increased as the thickness of the second reflecting unit 141 is increased, a thicker second reflecting unit 141 may be configured to improve the reflectivity of the second reflecting unit 141, so that more reflected light is formed after the secondary reflection, thereby reducing the light loss, that is, improving the light utilization rate.

In addition, the second reflecting unit 141 is disposed between the reflective electrode 1121 and the first reflecting layer 13. Compared with the process in which the light L1 formed after the reflection of the first reflecting unit 131 is reflected by the reflective electrode 1121, in the process in which the light L1 formed after the reflection of the first reflecting unit 131 is reflected by the second reflecting unit 141 for the second time, since the distance between the second reflecting unit 141 and the first reflecting unit 131 is less than the distance between the reflective electrode 1211 and the first reflecting unit 131, the propagation path of light may be shortened, and the light does not need to pass through film layers between the reflective electrode 1121 and the second reflecting unit 141, thereby reducing the light loss and further improving the light utilization rate.

Figure 4:
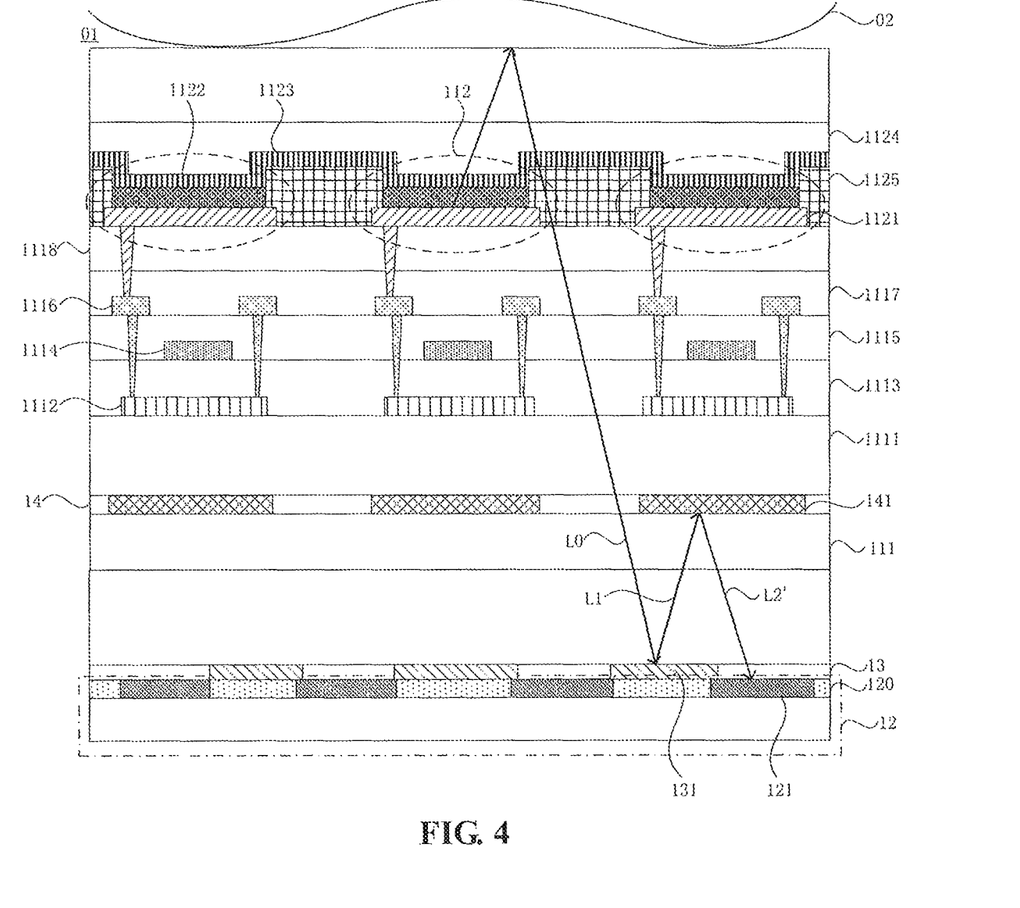
FIG. 4 is a sectional view of a structure of another display panel according to an embodiment of the present disclosure.

Exemplarily, FIG. 4 is a sectional view of a structure of another display panel according to an embodiment of the present disclosure. Referring to FIG. 4, the display panel 01 includes a buffer layer 1111, an active layer 1112, a gate insulating layer 1113, a gate layer 1114, an interlayer insulating layer 1115, a source/drain electrode layer 1116, a passivation layer 1117, a first planarization layer 1118, a film layer where the reflective electrode 1121 is located, a pixel defining layer 1125, a light-emitting material layer 1122, a counter electrode layer 1123 and a second planarization layer 1124, which are sequentially stacked along a direction in which the base substrate 111 is directed to the reflective electrode 1121. On the basis of the structure of the display panel 01, a second reflecting layer 14 may be disposed between any two of the above-mentioned layers which are between the reflective electrode 1121 and the base substrate 111, or the second reflecting layer 14 may be disposed in a same layer as any one of the above-mentioned layers which are between the reflective electrode 1121 and the base substrate 111. That is, the second reflecting unit 141 may be disposed in any of the above-mentioned film layers between the reflective electrode 1121 and the base substrate 111. In such way, the position of the second reflecting unit 141 may be flexibly set according to requirements.

Optionally, still referring to FIG. 4, the second reflecting unit 141 is disposed on a surface of the base substrate 111 facing to the light-emitting unit 112.

The first reflected light L1 formed after the reflection of the first reflecting unit 131 is directly irradiated to the second reflecting unit 141 merely via the base substrate 111 in the display assembly, and the second reflected light L2' formed after the first reflected light L1 is reflected by the second reflecting unit 141 for the second time is emitted merely via the base substrate 111 in the display assembly to the fingerprint recognition unit 121 and received by the fingerprint recognition unit 121.

In this process, the first reflected light L1 and the second reflected light L2' do not pass through the buffer layer 1111, the active layer 1112, the gate insulating layer 1113, the gate layer 1114, the interlayer insulating layer 1115, the source/drain electrode layer 1116, the passivation layer 1117 and the first planarization layer 1118, thereby reducing the light loss in the above-mentioned layers and at interfaces of the above-mentioned layers and improving the light utilization rate. At the same time, the irregular reflection or scattering of the first reflected light L1 which may exist in the above-mentioned metal film layers (such as the gate layer 1114 and the source/drain electrode layer 1116) may be avoided, thereby reducing crosstalk between light and improving the accuracy of fingerprint recognition of the display panel.

In addition, by configuring the second reflecting unit 141 on one side of driving function layer (including the active layer 1112, the gate insulating layer 1113, the gate layer 1114, the interlayer insulating layer 1115 and the source/drain electrode layer 1116 and the driving function layer includes a transistor) facing to the base substrate 111, since the second reflecting unit 141 can reflect the first reflected light L1 irradiated thereto, the light irradiated onto the transistor corresponding to the second reflecting unit 141 may be blocked by the second reflecting unit 141, that is, the influence of illumination on the performance of the transistor is avoided, thereby ensuring the image display effect of the display panel. Optionally, the second reflecting unit 141 may be a metal electrode layer, and by utilizing the good heat conduction uniformity of the metal electrode layer, the heat around the transistor may be quickly conducted to avoid the influence of temperature on the performance of the transistor, thereby ensuring the image display effect of the display panel.

Figure 5:
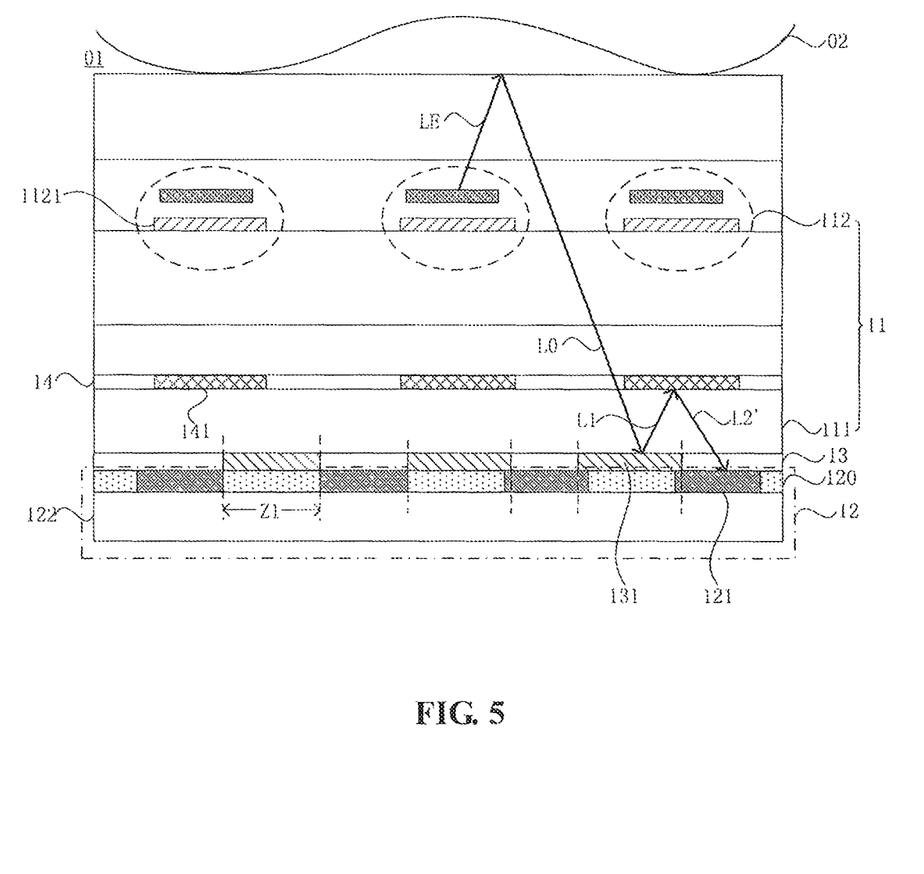
FIG. 5 is a sectional view of a structure of another display panel according to an embodiment of the present disclosure.

FIG. 5 is a sectional view of a structure of another display panel according to an embodiment of the present disclosure. Referring to FIG. 5, the fingerprint recognition assembly 12 is disposed on one side of the base substrate 111 facing away from the light-emitting unit 112. The fingerprint recognition assembly 12 further includes a circuit board 122, the fingerprint recognition unit 12 is electrically connected to the circuit board 122 and disposed on one side of the circuit board 122 facing to the base substrate 111, and the fingerprint recognition assembly 12 is attached to a surface of the base substrate 111.

In one embodiment, the structure of the display assembly 11 is a top emission structure. Light LE emitted from the light-emitting unit 112 does not pass through the driving function layer of the display panel, so that, in one aspect, the light emitting efficiency and the aperture ratio of the display panel are high; and in another aspect, the light LE emitted from the light-emitting unit 112 is not irradiated to the transistor of the driving function layer. That is, the influence of illumination on the performance of the transistor is avoided, thereby ensuring the image display effect of the display panel.

In one embodiment, the fingerprint recognition unit is an external fingerprint recognition unit, and exemplarily, is adhered to the surface of the base substrate 111 of the display panel with glue. The circuit board 122 is configured to post process electrical signals fed back by the fingerprint recognition unit 122 to acquire results of fingerprint recognition.

Figure 6:
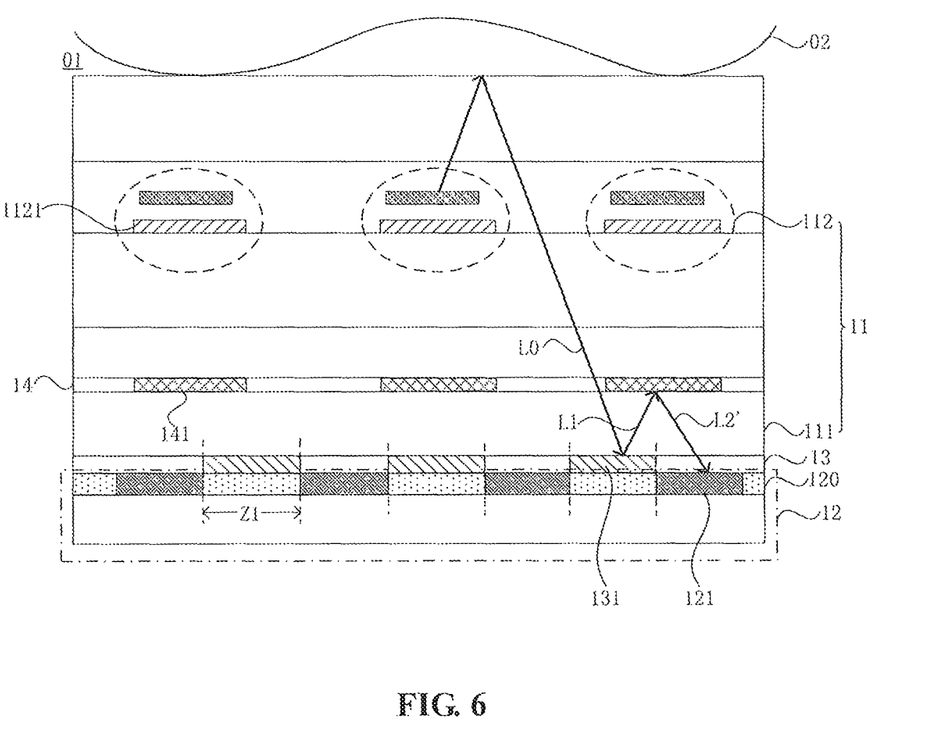
FIG. 6 is a sectional view of a structure of another display panel according to an embodiment of the present disclosure.

FIG. 6 is a sectional view of a structure of another display panel according to an embodiment of the present disclosure. Referring to FIG. 6, the fingerprint recognition assembly 12 includes a plurality of fingerprint recognition units 121, and a vertical projection Z1 of the first reflecting unit 131 on a film layer 120 where the plurality of fingerprint recognition units 121 are located is in an area between adjacent two of the plurality of fingerprint recognition units 121.

In such a way, the first reflecting unit 131 may reflect only light which is irradiated to the area between the adjacent two of the plurality of fingerprint recognition units 121. That is, the first reflecting unit 131 reflects only the light which is not directly received by the plurality of fingerprint recognition units 121, without affecting the intensity of light which can be directly irradiated to the plurality of fingerprint recognition units 121.

It should be noted that, the vertical projection Z1 of the first reflecting unit 131 on the film layer 120 where the plurality of fingerprint recognition units 121 are located may cover part of the plurality of fingerprint recognition units 121.

In one embodiment, the position of the first reflecting unit 131 in the fingerprint recognition assembly 12 may be divided into two types: one is that the first reflecting unit 131 and the plurality of fingerprint recognition units 121 are located in different layers, and the other one is that the first reflecting unit 131 and the plurality of fingerprint recognition units 121 are located in a same layer.

Optionally, still referring to FIG. 6, the first reflecting unit 131 is disposed on a surface of the film layer 120 where the plurality of fingerprint recognition units 121 are located, and the surface of the film layer 120 faces to the base substrate 111.

In such a way, the distance between the first reflecting unit 131 and the display assembly 11 may be reduced, so that the propagation distance between the light L0 reflected from the touch object 02 and the first reflected light L1 formed by the reflection of the first reflecting unit 131 may be shortened and light loss of the light L0 and the first reflected light L1 may be reduced, thereby improving the light utilization rate and improving the success rate of fingerprint recognition of the display panel.

Figure 7:
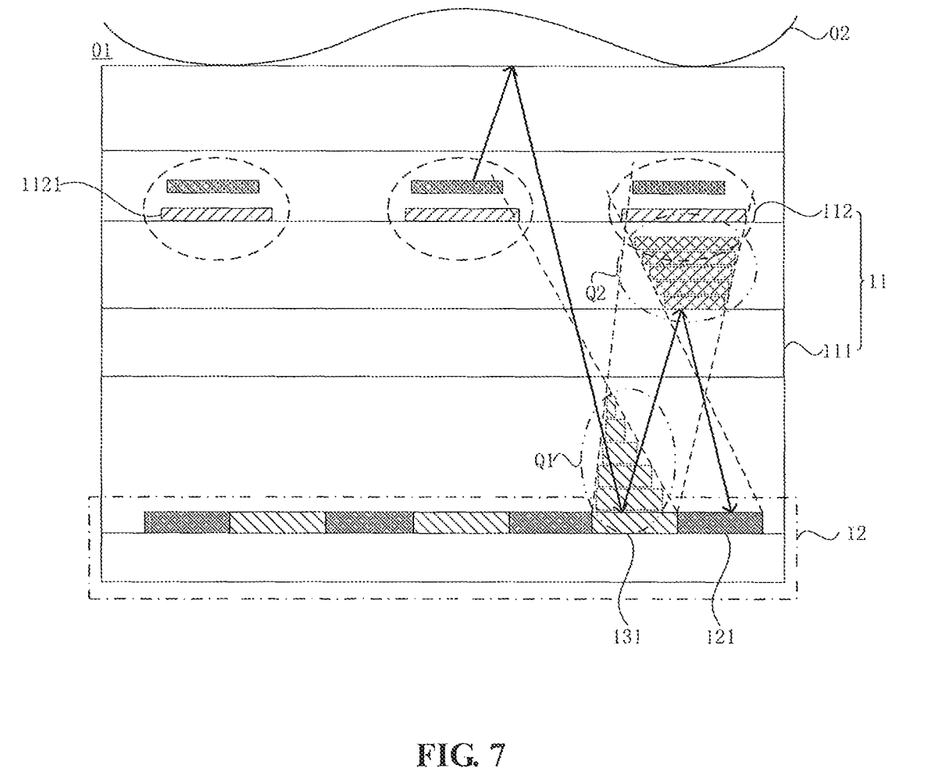
FIG. 7 is a diagram showing a setting region of a first reflecting unit and a second reflecting unit according to an embodiment of the present disclosure.

In one embodiment, the size of the first reflecting unit 131 and the second reflecting unit 141 in a plane parallel to the base substrate 111 may be set according to their relative positions with the plurality of fingerprint recognition units 121. Exemplarily, FIG. 7 is a schematic diagram of a setting region of a first reflecting unit and a second reflecting unit according to an embodiment of the present disclosure. Referring to FIG. 7, as the distance between the first reflecting unit 131 and the plurality of fingerprint recognition units 121 is increased along a direction perpendicular to the base substrate 111, the size of the first reflecting unit 131 in the plane parallel to the base substrate 111 is reduced. For example, an area Q1 in FIG. 7 shows the change trend of the size of the first reflecting unit 131. As the distance between the second reflecting unit 141 and the plurality of fingerprint recognition units 121 is reduced along the direction perpendicular to the base substrate 111, the size of the second reflecting unit 141 in the plane parallel to the base substrate 111 is reduced. For example, an area Q2 in FIG. 7 shows the change trend of the size of the second reflecting unit 141.

In such a way, the first reflecting unit 131 and the second reflecting unit 141 may reflect the light which is not directly irradiated to the fingerprint recognition unit 121 without affecting the light which is directly irradiated to the fingerprint recognition unit 121.

Figure 8:
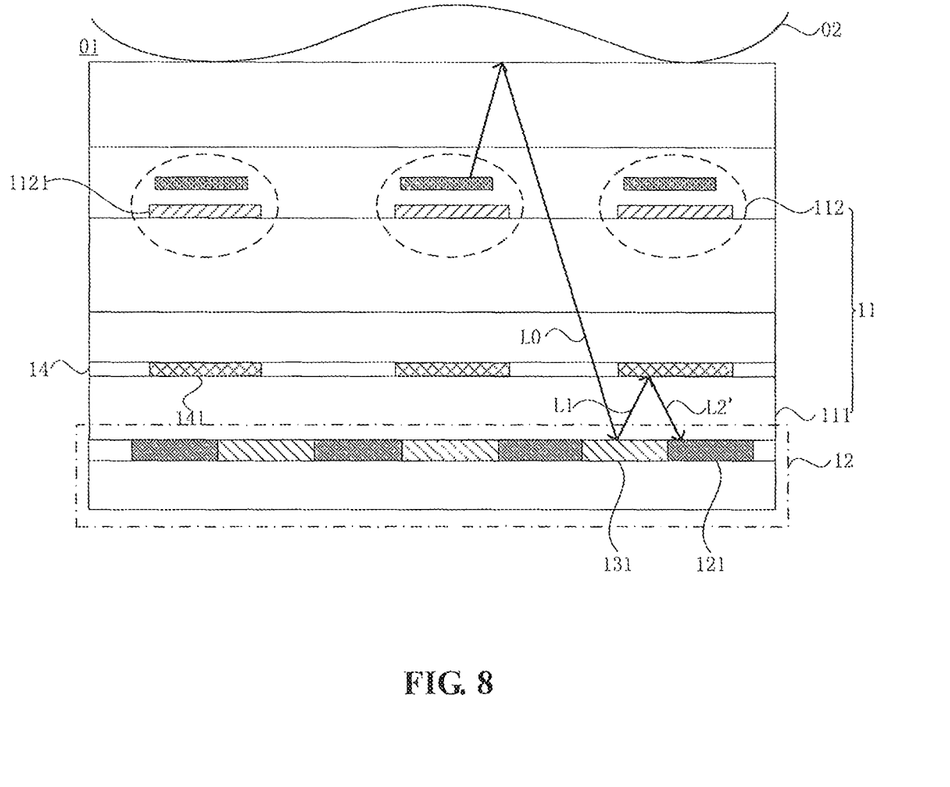
FIG. 8 is a sectional view of a structure of another display panel according to an embodiment of the present disclosure.

Optionally, FIG. 8 is a sectional view of a structure of another display panel according to an embodiment of the present disclosure. Referring to FIG. 8, the first reflecting unit 131 is disposed between two adjacent fingerprint recognition units 121.

In one embodiment, the first reflecting unit 131 and the fingerprint recognition unit 121 are disposed in a same layer, reducing the overall thickness of the fingerprint recognition assembly 12, so that the propagation distance between the light L0 reflected from the touch object 02 and the first reflected light L1 formed by the reflection of the first reflecting unit 131 and the propagation distance between the light L0 and the second reflected light L2 formed by the reflection of the second reflecting unit 141 are reduced. Therefore, the light loss of the light L0, the first reflected light L1 and the second reflected light L2 is reduced, thereby improving the light utilization rate and improving the success rate of fingerprint recognition of the display panel.

Optionally, the thickness of the first reflecting unit 131 is 130 μm-150 μm and/or the second reflecting unit 141 is 130 μm-150 μm.

In such a way, light irradiated to the first reflecting unit 131 and/or the second reflecting unit 141 is completely reflected, thereby reducing transmission light loss. The light which is not directly irradiated to the fingerprint recognition unit 121 may be received by the fingerprint recognition unit 121 after two complete reflection processes, thereby improving the intensity of light received by the fingerprint recognition unit 121 and improving the success rate of fingerprint recognition.

Optionally, the first reflecting layer 13 is a metal reflecting layer and/or the second reflecting layer 14 is a metal reflecting layer, and the material of the metal reflecting layer includes sliver.

Since the reflectivity of the silver material is high, the material of the reflective electrode 1121 is usually silver. Therefore, the first reflecting layer 13 and/or the second reflecting layer 14 may be formed by using a device for forming the reflective electrode 1121 with no need to introduce a new device, thereby saving costs.

Exemplarily, a vertical projection of the second reflecting unit 141 on the base substrate 111 may completely coincide with a vertical projection of the reflective electrode 1121 on the base substrate 111. At the moment, the second reflecting unit 141 and the reflective electrode 1121 may be respectively formed by using the same mask plate. Alternatively, the vertical projection of the second reflecting unit 141 on the base substrate 111 may further completely coincide with a vertical projection of the light-emitting material layer of the light-emitting unit 112 on the base substrate 111. At the moment, the second reflecting unit 141 and the light-emitting material layer of the light-emitting unit 112 may be formed by using the same mask plate. Therefore, no new mask plate is required to be designed, which saves the manufacturing cost of the mask plate, thereby saving the manufacturing cost of the display panel.

Exemplarily, the first reflecting unit 131 and/or the second reflecting unit 141 may be formed through a mask evaporation method or an evaporation-after-etching method. It should be noted that the manner of forming the first reflecting layer 13 and the second reflecting layer 14 is not limited in the embodiments of the present disclosure.

Figure 9:
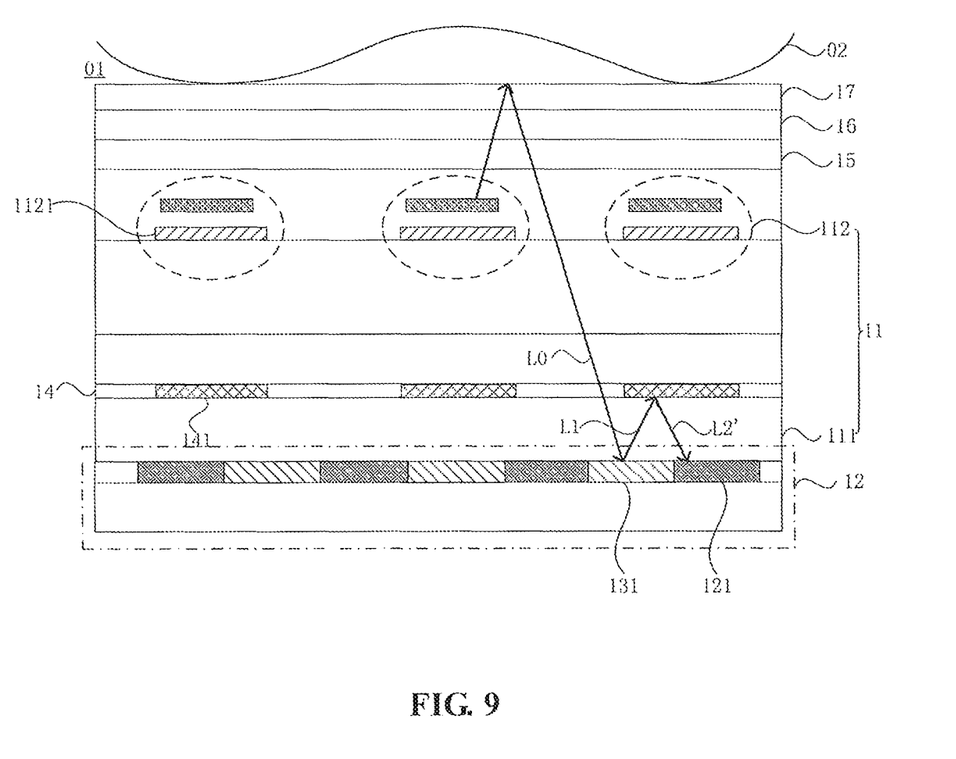
FIG. 9 is a sectional view of a structure of another display panel according to an embodiment of the present disclosure.

FIG. 9 is a sectional view of a structure of another display panel according to an embodiment of the present disclosure. Referring to FIG. 9, the display panel 01 further includes an encapsulation layer 15, a polarizer 16 and a glass cover 17 which are sequentially stacked on one side of the light-emitting unit 112 facing away from the base substrate 111.

The encapsulation layer 15 is configured to insulate water and oxygen to ensure the stability of each film layer of the display panel 01, thereby prolonging the service life of the display panel 01. The polarizer 16 is configured to block the reflection of the natural light outside, so that the display panel 01 has a relatively high contrast; and at the same time, the polarizer is configured to completely block the visible spectrum outside, thereby achieving an integrative black effect. The glass cover 17 is configured to protect the whole display panel 01. Exemplarily, the encapsulation layer 15 may be a stacked encapsulation layer formed of a plurality of layers of organic materials and inorganic materials.

Figure 10:
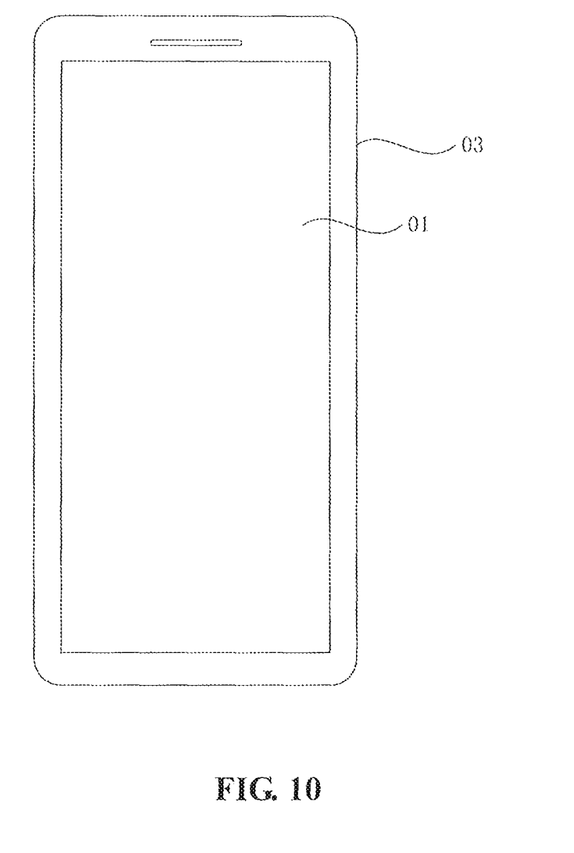
FIG. 10 is a structural diagram of a display device according to an embodiment of the present disclosure.

In addition, the present disclosure further provides a display device. The display device includes the display panel of any one of preceding embodiments of the present disclosure. Therefore, the display device has the beneficial effects of the above-mentioned display panel, and details about that are not described here again. Exemplarily, FIG. 10 is a structural diagram of a display device according to an embodiment of the present disclosure. Referring to FIG. 10, the display device 03 includes the display panel 01 of any one of preceding embodiments of the present disclosure. Exemplarily, the display device 03 may be a device with display functions, e.g. a mobile phone, a computer and a smart wearable device, and no limitations are made thereto.

The display panel and the display device provided by the present disclosure dispose a first reflecting layer. The first reflecting layer is disposed on one side of a reflective electrode facing to a fingerprint recognition assembly, the first reflecting layer includes at least one first reflecting unit, and part or all of a vertical projection of the first reflecting unit on a film layer where a finger recognition unit is located is in an area other than the finger recognition unit. At least part of the light, which is not irradiated to the fingerprint recognition unit, reflected by a touch object (i.e., a finger) is reflected by the first reflecting layer, reflected light formed after the reflection of the first reflecting unit is reflected by the reflective electrode of a light-emitting unit for a second time, and reflected light formed after the secondary reflection is irradiated to the finger recognition unit and received by the finger recognition unit to perform fingerprint recognition. In view of this, at least part of fingerprint signal light which is not directly irradiated to the fingerprint recognition unit in the existing display panel is irradiated to the fingerprint recognition unit via the reflection of the first reflecting unit and the reflective electrode, to increase the fingerprint signal light received by the fingerprint recognition unit. Therefore, the utilization rate of the light reflected by the touch object is increased, thereby improving the success rate of fingerprint recognition of the display panel. In addition, the embodiment of the present disclosure may avoid the high-brightness illumination of the light-emitting unit during the fingerprint recognition process, so that the service life of the light-emitting material in the light-emitting unit may be prolonged, thereby prolonging the service life of the display panel and the display device.

It should be noted that the above are only preferred embodiments of the present disclosure and the technical principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
    a display assembly, wherein the display assembly comprises a base substrate and a plurality of light-emitting units disposed on one side of the base substrate, wherein each of the plurality of light-emitting units comprises a reflective electrode;
    a fingerprint recognition assembly disposed on one side of the reflective electrode facing away from a light emitting surface of the plurality of light-emitting units, wherein the fingerprint recognition assembly comprises at least one fingerprint recognition sensor, and the at least one fingerprint recognition sensor is configured to perform fingerprint recognition; and
    a first reflecting layer disposed on one side of the reflective electrode facing to the fingerprint recognition assembly, wherein the first reflecting layer comprises at least one first reflecting unit, and at least part of a vertical projection of the first reflecting unit on a film layer where the fingerprint recognition sensor is located is in an area other than the fingerprint recognition sensor;
    wherein the display panel further comprises a second reflecting layer disposed between the reflective electrode and the first reflecting layer, wherein the second reflecting layer comprises at least one second reflecting unit, and a vertical projection of the second reflecting unit on a film layer where the reflective electrode is located is located in the reflective electrode.

2. The display panel according to claim 1, wherein the fingerprint recognition assembly is disposed on one side of the base substrate facing away from the plurality of light-emitting units.

3. The display panel according to claim 2, wherein the fingerprint recognition assembly further comprises a circuit board, the fingerprint recognition sensor is electrically connected to the circuit board and disposed on one side of the circuit board facing to the base substrate, and the fingerprint recognition assembly is attached to a surface of the base substrate.

4. The display panel according to claim 1, wherein the second reflecting unit is disposed on a surface of the base substrate facing to the plurality of light-emitting units.

5. The display panel according to claim 1, wherein the fingerprint recognition assembly comprises a plurality of the fingerprint recognition sensors, and a vertical projection of the first reflecting unit on a film layer where the plurality of the fingerprint recognition sensors are located is in an area between adjacent two of the plurality of fingerprint recognition sensors.

6. The display panel according to claim 5, wherein the first reflecting unit is disposed on a surface of the film layer where the plurality of fingerprint recognition sensors are located, and the surface of the film layer faces to the base substrate.

7. The display panel according to claim 5, wherein the first reflecting unit is disposed between adjacent two of the plurality of fingerprint recognition sensors.

8. The display panel according to claim 1, wherein a thickness of the first reflecting unit is 130 µm-150 µm.

9. The display panel according to claim 1, wherein a thickness of the second reflecting unit is 130 µm-150 µm.

10. The display panel according to claim 1, wherein a thickness of the first reflecting unit is 130 µm-150 µm and a thickness of the second reflecting unit is 130 µm-150 µm.

11. The display panel according to claim 1, wherein the first reflecting layer is a metal reflecting layer, wherein a material of the metal reflecting layer comprises silver.

12. The display panel according to claim 1, wherein the second reflecting layer is a metal reflecting layer, wherein a material of the metal reflecting layer comprises silver.

13. The display panel according to claim 1, wherein the first reflecting layer is a metal reflecting layer and the second reflecting layer is a metal reflecting layer, wherein a material of the metal reflecting layer comprises silver.

14. The display panel according to claim 1, further comprising an encapsulation layer, a polarizer and a glass cover which are sequentially stacked on one side of the plurality of light-emitting units facing away from the base substrate.

15. A display device, comprising a display panel, wherein the display panel comprises:
a display assembly, wherein the display assembly comprises a base substrate and a plurality of light-emitting units disposed on one side of the base substrate, wherein each of the plurality of light-emitting units comprises a reflective electrode;
a fingerprint recognition assembly disposed on one side of the reflective electrode facing away from a light emitting surface of the plurality of light-emitting units, wherein the fingerprint recognition assembly comprises at least one fingerprint recognition sensor, and the at least one fingerprint recognition sensor is configured to perform fingerprint recognition; and
a first reflecting layer disposed on one side of the reflective electrode facing to the fingerprint recognition assembly, wherein the first reflecting layer comprises at least one first reflecting unit, and at least part of a vertical projection of the first reflecting unit on a film layer where the fingerprint recognition sensor is located is in an area other than the fingerprint recognition sensor;
wherein the display panel further comprises a second reflecting layer disposed between the reflective electrode and the first reflecting layer, wherein the second reflecting layer comprises at least one second reflecting unit, and a vertical projection of the second reflecting unit on a film layer where the reflective electrode is located is located in the reflective electrode.

16. A display panel, comprising:
a display assembly, wherein the display assembly comprises a base substrate and a plurality of light-emitting units disposed on one side of the base substrate, wherein each of the plurality of light-emitting units comprises a reflective electrode;
a fingerprint recognition assembly disposed on one side of the reflective electrode facing away from a light emitting surface of the plurality of light-emitting units, wherein the fingerprint recognition assembly comprises a plurality of fingerprint recognition sensors, and the plurality of fingerprint recognition sensors are configured to perform fingerprint recognition; and
a first reflecting layer disposed on one side of the reflective electrode facing to the fingerprint recognition assembly, wherein the first reflecting layer comprises at least one first reflecting unit, and wherein the first reflecting unit is disposed between adjacent two of the plurality of fingerprint recognition sensors, the first reflecting unit and the plurality of fingerprint recognition sensors are disposed in a same layer, and a vertical projection of the first reflecting unit on a film layer where the plurality of the fingerprint recognition sensors are located is in an area between adjacent two of the plurality of fingerprint recognition sensors.

* * * * *